United States Patent
Liaw et al.

(10) Patent No.: US 7,692,230 B2
(45) Date of Patent: Apr. 6, 2010

(54) MRAM CELL STRUCTURE

(75) Inventors: Jhon Jhy Liaw, Hsinchu (TW); Yu-Jen Wang, Hsinchu (TW); Chia-Shiung Tsai, Hsinchu (TW)

(73) Assignee: Taiwan Semiconductor Manufacturing Co. Ltd., Hsinchu (TW)

( * ) Notice: Subject to any disclaimer, the term of this patent is extended or adjusted under 35 U.S.C. 154(b) by 0 days.

(21) Appl. No.: 11/674,581

(22) Filed: Feb. 13, 2007

(65) Prior Publication Data

US 2008/0135957 A1    Jun. 12, 2008

Related U.S. Application Data

(60) Provisional application No. 60/868,733, filed on Dec. 6, 2006.

(51) Int. Cl.
*H01L 27/108* (2006.01)
(52) U.S. Cl. .................. 257/296; 257/298; 257/300; 257/758; 257/774; 257/E27.084; 257/E27.086; 257/E27.098
(58) Field of Classification Search .......... 257/296, 257/298, 300, 310, 311, 758, 773, 774, E29.323, 257/E27.084–E27.086, E27.098
See application file for complete search history.

(56) References Cited

U.S. PATENT DOCUMENTS

| | | | | |
|---|---|---|---|---|
| 6,956,765 B2* | 10/2005 | Saito et al. | .................. | 365/158 |
| 6,977,181 B1* | 12/2005 | Raberg | .......................... | 438/3 |
| 2004/0004889 A1* | 1/2004 | Asao et al. | .................. | 365/222 |
| 2005/0232006 A1* | 10/2005 | Iwata | .......................... | 365/171 |

\* cited by examiner

*Primary Examiner*—Matthew E Warren
(74) *Attorney, Agent, or Firm*—Baker & McKenzie LLP

(57) ABSTRACT

Disclosed herein is an improved memory device wherein the area occupied by a conventional landing pad is significantly reduced to around 50% to 10% of the area occupied by conventional landing pads. This is accomplished by removing the landing pad from the cell structure, and instead forming a conductive via structure that provides the electrical connection from the memory stack or device in the structure to an under-metal layer. By forming only this via structure, rather than separate vias formed on either side of a landing pad, the overall width occupied by the connective via structure from the memory stack to an under-metal layer is substantially reduced, and thus the via structure and under-metal layer may be formed closer to the memory stack (or conductors associated with the stack) so as to reduce the overall width of the cell structure.

20 Claims, 6 Drawing Sheets

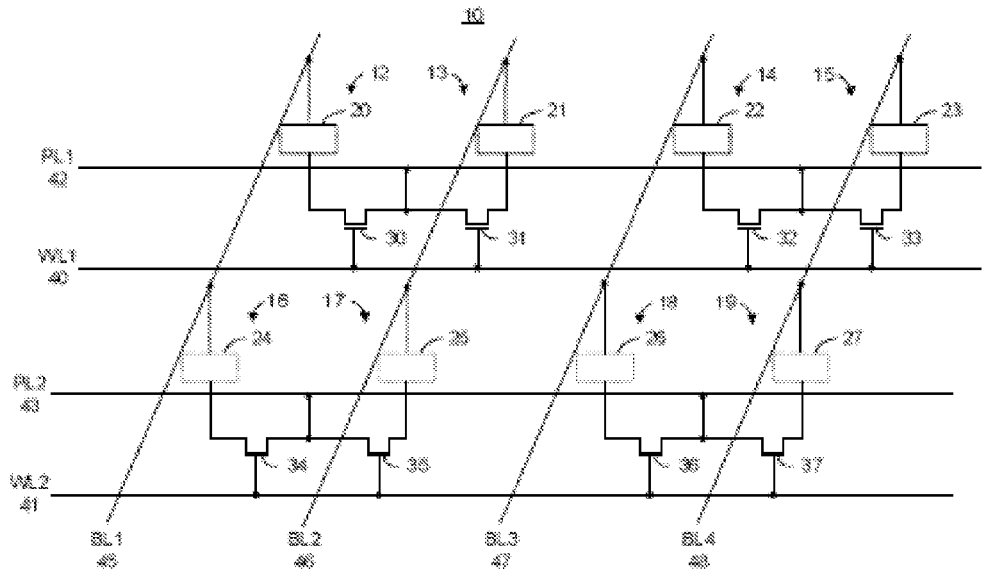
FIGURE 1 (PRIOR ART)
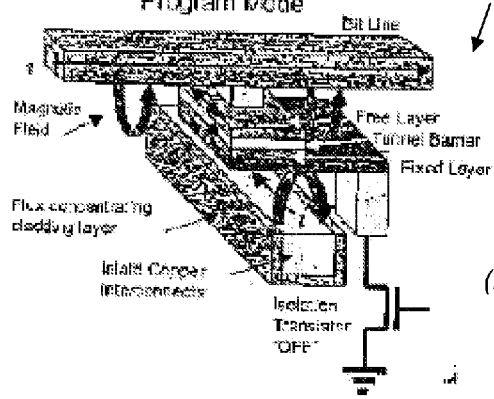
FIGURE 1A
(PRIOR ART)
FIGURE 2
(PRIOR ART)
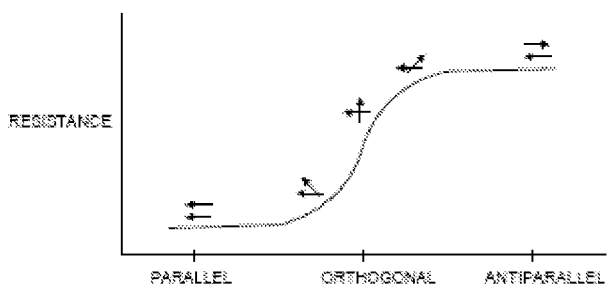
FIGURE 3
(PRIOR ART)

MRAM New cell structure top view
Under layers metal/via

MRAM CELL STRUCTURE

CROSS-REFERENCE TO RELATED APPLICATIONS

This application claims priority to U.S. Provisional Application No. 60/868,733, filed Dec. 6, 2006, and entitled "New MRAM Cell Structure," of which the entire contents are hereby incorporated by reference for all purposes.

TECHNICAL FIELD

This invention relates to semiconductor memory devices, particularly those utilizing a magnetoresistive structure for data storage.

BACKGROUND

Progressive development of handheld and multimedia applications accelerates the demand for unified memory technology, replacing data/code (flash, ROM) and execution (DRAM and SRAM) storage media using a single die. MRAM (Magnetic Random Access Memory) offers the unique combination of non-volatility, high endurance and excellent random access speed to become such a new prevalent memory technology. MRAM is non-volatile memory that uses magnetism rather than electrical power to store data.

The major structure of a typical MRAM cell is the MTJ (Magnetic Tunnel Junction) stack, as well as one transistor. The MTJ stack is composed of a pinned magnetic layer, a tunnel barrier, and a free magnetic layer, all sandwiched between top and bottom electrodes. Electrons, spin polarized by the magnetic layer, traverse the tunnel barrier. A parallel alignment of the pinned and free magnetic layers results in a low resistance state, while an anti-parallel alignment results in a high resistance state. In MRAM cell metal routing, the word lines extend along rows of the memory cells, and bit lines extend along columns of the memory cells. Each memory cell is located at a cross point of a word line and a bit line. The memory cell stores a bit (or multiple bits) of information as an orientation of a magnetization. The magnetization of each memory cell assumes one of two stable orientations at any given time. These two stable orientations, parallel and anti-parallel, represent logic values of "0" and "1".

The conventional MRAM cell also includes a thin oxide pass transistor, which is electrically connected to the MTJ stack by the bottom or top electrode conductors. As for data input ("writing" to the MRAM cell), a wider bit line and write word line are often used on the MTJ stack top or bottom portion for data writing. As future MRAM cell size continues to shrink, several limiting factors become prevalent. Included in these factors are MTJ stack size, the size of the under-layer write word line, and the size of the connection path between the bottom electrode and the pass transistor.

For the connection path of the MTJ stack bottom electrode to the pass transistor, the gating factor is the minimum area of metal landing pad that located in the same metal layer with the under-layer write word line. In conventional structures, this landing pad is found in the connection from the bottom electrode to an under-layer metal (near the pass transistor), using vias on either side of it. However, considering metal rule continuous shrinkage, a challenge is faced on process margin tradeoff between line-space isolation and minimum landing pad opening (a hole-like shape (damascene process)). Specifically, the area shrinkage (area×$S^2$ factor) factor is 1× order faster than the line shrinkage (pitch×S factor) factor. This 2-D effect induces a process margin concern from conflict requirements of line shape (bridge concern: middle or low exposure energy) and hole shape (blind concern: higher exposure energy). This results in landing margin concern on the upper-layer via hole to this metal layer, or this metal layer to the bottom-layer via hole. So as device size continues to decrease, this metal landing pad area and the write word line width will become the bottleneck of the cell size shrinkage, for example, in 90 nm and beyond.

SUMMARY

Disclosed herein is an improved memory device wherein the area occupied by a conventional landing pad is significantly reduced to around 50% to 10% of the area occupied by conventional landing pads. This is accomplished by removing the landing pad from the cell structure, and instead forming a conductive via structure that provides the electrical connection from the memory stack or device in the structure to an under-metal layer. By forming only this via structure, rather than separate vias formed on either side of a landing pad, the overall width occupied by the connective via structure from the memory stack to an under-metal layer is substantially reduced, and thus the via structure and under-metal layer may be formed closer to the memory stack (or conductors associated with the stack) so as to reduce the overall width of the cell structure.

In an exemplary embodiment, the disclosed principles provide a memory cell structure having a memory stack having a bottom electrode and a top electrode. The cell structure further includes a conductive extender electrically connected to the bottom electrode and having an extending portion laterally extending from the memory stack, where the memory stack is formed on a main portion of the extender. In such embodiments, the cell structure further includes a data control line for controlling a memory state of the memory stack formed directly under the memory stack and the main portion of the extender. Also, such a cell structure includes an under-metal layer formed under at least a portion of the extending portion and under at least a portion of the data control line, the under-metal layer electrically coupled to a switching device for reading the memory state of the memory stack. Finally, this exemplary cell structure includes a via structure directly connecting the extending portion to the under-metal layer, and formed directly and laterally adjacent to the data control line.

In a more specific embodiment, the disclosed principles provide an MRAM cell structure comprising an MTJ stack having a bottom electrode and a top electrode. This structure also includes a conductive extender electrically connected to the bottom electrode and having an extending portion laterally extending from the MTJ stack, where the MTJ stack is formed on a main portion of the extender. In such embodiments, the MRAM cell structure also includes a write wordline for controlling a magnetic state of the MTJ stack formed directly under the MTJ stack and the main portion of the extender. Also included is a read wordline electrically coupled to a switching device for reading the magnetic state of the MTJ stack, and formed partially under the extending portion and partially under the main portion of the extender. Then, the MRAM cell structure includes a via structure directly connecting the extending portion to the read wordline, and formed directly and laterally adjacent to the write wordline.

In another aspect, the disclosed principles provide a method of manufacturing a memory cell structure. In one embodiment, the method comprises forming an under-metal layer electrically coupled to a switching device for reading a memory state of a memory stack, and forming a via structure on and electrically connected to the under-metal layer. The exemplary method also includes forming a data control line for controlling the memory state of the memory stack directly and laterally adjacent to the via structure, and forming a conductive extender having a main portion located over the data control line and having an extending portion laterally extending over the under-metal layer. In addition, such methods include forming a memory stack having a bottom electrode and a top electrode on the main portion of the extender and directly over the data control line, wherein the via structure is directly connects the extending portion to the under-metal layer.

BRIEF DESCRIPTION OF THE DRAWINGS

FIG. 1 illustrates a schematic diagram of a portion of a conventional MRAM array;

FIG. 1A illustrates an isometric view of a single conventional MRAM memory cell during a write process;

FIG. 2 illustrates an example of a typical MTJ stack structure;

FIG. 3 illustrates the change in electrical resistance through an MTJ stack;

DETAILED DESCRIPTION

Figure 4:
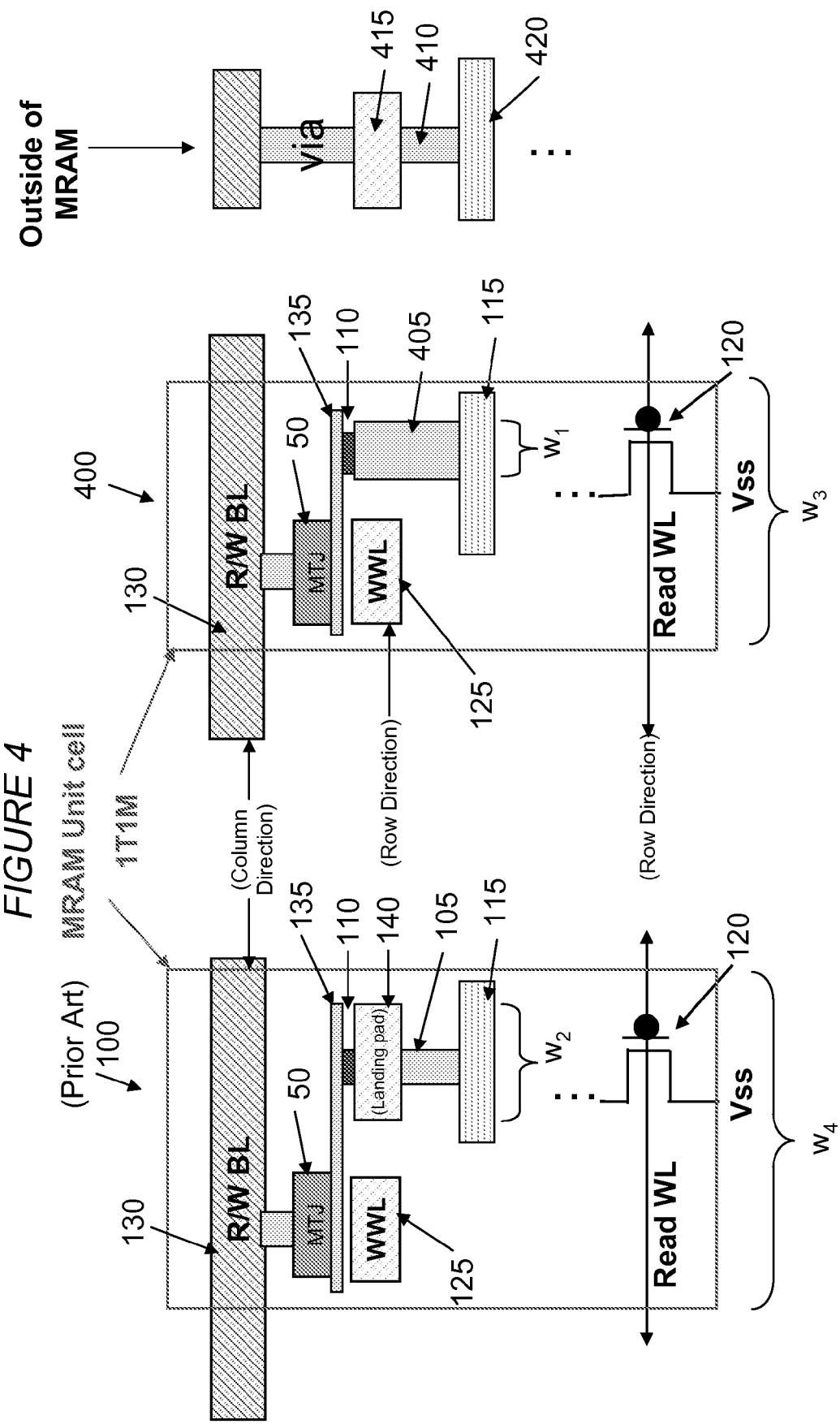
FIG. 4 illustrates cross-sectional views of an MRAM cell constructed as disclosed herein as compared to a conventional MRAM cell structure.

FIG. 1 shows a schematic diagram of a portion 10 of an MRAM array, which includes a plurality of memory cells 12-19 and a series of conductive lines 40-48. Each memory cell 12-19 includes a magnetoresistive (MR) memory element 20-27 and a transistor 30-37. For this reason, the architecture shown in FIG. 1 is referred to as 1T1MTJ (one transistor, one MTJ) architecture.

As shown in FIG. 1, the transistors 30-33 are coupled to each other via a word line (WL1) 40, and transistors 34-37 are coupled to each other via a word line (WL2) 41, where the word lines 40, 41 form the gate electrode for the transistors 30-37. The transistors 30-33 are also coupled to each other via a program line (PL1) 42, and transistors 34-37 are coupled via a program line (PL2) 43, where the program lines 42, 43 serve as virtual ground lines. Similarly, the MR memory elements 20 and 24 are coupled to each other by bit line (BL1) 45, MR memory elements 21 and 25 are coupled to each other by bit line (BL2) 46, MR memory elements 22 and 26 are coupled to each other by bit line (BL3) 47, and MR memory elements 23 and 27 are coupled to each other by bit line (BL4) 48. The bit lines 45-48 are typically somewhat perpendicular to the word lines 40, 41 and the program lines 42, 43. FIG. 1A illustrates an isometric view of a single MRAM memory cell 100 during a write process.

Each of the MR memory elements 20-27 can be a multi-layer magnetoresistive structure, such as a magnetic tunneling junction (MTJ) or a giant magnetoresistive (GMR) structure. FIG. 2 shows an example of a typical MTJ structure 50. The MTJ structure 50 includes four basic layers: a free layer 52, a spacer 54 which serves as a tunneling barrier, a pinned layer 56, and a pinning layer 58. The free layer 52 and the pinned layer 56 are constructed of ferromagnetic material, for example cobalt-iron or nickel-cobalt-iron. The pinning layer 58 is constructed of antiferromagnetic material, for example platinum manganese. Magnetostatic coupling between the pinned layer 56 and the pinning layer 58 causes the pinned layer 56 to have a fixed magnetic moment. The free layer 52, on the other hand, has a magnetic moment that, by application of a magnetic field, can be switched between a first orientation, which is parallel to the magnetic moment of the pinned layer 56, and a second orientation, which is antiparallel to the magnetic moment of the pinned layer 56.

The spacer 54 interposes the pinned layer 56 and the free layer 52. The spacer 54 is composed of insulating material, for example aluminum oxide, magnesium oxide, or tantalum oxide. The spacer 54 is formed thin enough to allow the transfer (tunneling) of spin-aligned electrons when the magnetic moments of the free layer 52 and the pinned layer 56 are parallel. On the other hand, when the magnetic moments of the free layer 52 and the pinned layer 56 are antiparallel, the probability of electrons tunneling through the spacer 54 is reduced. This phenomenon is commonly referred to as spin-dependent tunneling (SDT).

As shown in FIG. 3, the electrical resistance through the MTJ 50 (e.g., from layer 52 to layer 58 or vice-versa) increases as the moments of the pinned and free layers become more antiparallel and decreases as they become more parallel. In an MRAM memory cell, the electrical resistance of the MTJ 50 can therefore be switched between first and second resistance values representing first and second logic states. For example, a high resistance value can represent a logic state "1" and a low resistance value can represent a logic state "0." The logic states thus stored in a memory cell can be read by passing a sense current through the MR memory element and sensing the resistance. For example, referring back to FIG. 1, the logic state of memory cell 12 can be read by passing a sense current through bit line (BL1) 45, activating transistor 30 via word line (WL1) 40, and sensing the current passing from (BL1) 45 through the MTJ 20 and on to program line (PL1) 42.

During a write operation, electrical current flows through a program line 42, 43 and a bit line 45-48 that intersect at the target memory cell 12-19. For example, in order to write to memory cell 13, a current is passed through program line (PL1) 42 and a current is passed through bit line (BL2) 46. The magnitude of these currents is selected such that, ideally, the resulting magnetic fields are not strong enough on their own to affect the memory state of the MR memory elements 20-23 and 25, but the combination of the two magnetic fields (at MR memory element 21) is sufficient for switching the memory state (e.g., switching the magnetic moment of the free layer 52) of the MR memory element 21.

FIG. 4 illustrates cross-sectional views of an MRAM cell 400 constructed as disclosed herein as compared to a conventional MRAM cell 100 structure. In this embodiment, the landing pad used in the conventional cell 100 has been completely removed from the final structures, as shown. As such, a new "$1^{st}$ via" 405 now extends from the "$3^{rd}$ via" 110 (which is connected to the bottom electrode of the MTJ stack) to the "$2^{nd}$ metal layer" 115 (which is an under-layer metal connected to the pass transistor 120). Thus, the space or area (e.g., chip real estate) occupied by the new $1^{st}$ via 405 is less than that previously occupied by the conventional landing pad. In addition, the manufacturing process is simplified by eliminating the steps needed to manufacture the landing pad, by simply manufacturing the $1^{st}$ via 405 to be directly connected from the under-layer $2^{nd}$ metal 115 to the $3^{rd}$ via 110 in one process.

Key Differences Over Conventional Structures

1. Not need the conventional metal landing pad as the connection layer from the upper via (the $3^{rd}$ via) to the under via (the $1^{st}$ via) present in the conventional cell structure 100 illustrated in FIG. 4.
2. The disclosed technique results in a continuous and smooth dual damascene metal structure (e.g., the new $1^{st}$ via 405), rather than the stepped conventional structure provided by the bottom via 105, conventional landing pad, and upper via 110.
3. A new metal routing is provided in MRAM cells 400 constructed as disclosed herein by reducing the area width previously occupied by the conventional landing pad, as disclosed in FIG. 5.

Advantages Over Conventional Structures

1. The disclosed technique meets the dual damascene metal layer shrink ratio on both the line layer and minimum area.
2. The disclosed technique provides a wider lithography process margin on dual damascene metal structures since the final width, now occupied only by the $1^{st}$ via 405, is less than the previous width occupied by the conventional landing pad.
3. The disclosed technique imposes no additional cost to the MRAM manufacturing process since the $1^{st}$ via is simply manufactured larger than in conventional designs to occupy the space previously occupied by the conventional landing pad.

Exemplary Embodiments

FIG. 4 illustrates a new structure for a memory cell constructed as disclosed herein. The new structure provides for a memory array having a resistive cross point array of memory cells 400. Each memory cell 400 is located at a cross point of a wordline and a bitline. Looking specifically at FIG. 4, illustrated is a single memory cell 400 structure, where the memory cell 400, in this embodiment, is an MRAM cell 400 having an MTJ stack 50 that comprises a top electrode, a tunneling dielectric, and a bottom electrode, such as the example illustrated in FIG. 2. Each MRAM cell 400 stores a bit (or multiple bits) of information as an orientation of magnetization, as described above. Although the cell 400 is illustrated as an MRAM cell, the memory cell 400 may be any type of magnetic memory cell. In other embodiments, the memory cell 400 may be an SRAM, DRAM, or other non-volatile memory cell, or a combination thereof.

For the MRAM cell 400 metal routing, a read/write bitline (R/W BL) 130 is connected to the top electrode, and a data control line, in the form of a write wordline (WWL) 125, is located under MTJ stack 50, but not in contact with it. In this embodiment, write wordlines 125 are extended along rows of the memory cells (i.e., the "row direction"), and bitlines 130 extend along columns of the memory cells (i.e., the "column direction"). The first and second directions may be substantially perpendicular to each other, however, this is not required.

Read control is provided for the magnetic state of the MTJ stack 50 using a pass or switching transistor 120. The pass transistor 120 is operated using a read wordline, which is also aligned in the row direction in this embodiment. The read structure from the pass transistor 120 is constructed using a metal extender 135, which is electrically coupled to the bottom electrode of the MTJ stack 50, an under-metal layer 115, which is electrically connected to the pass transistor 120, and a "first via layer" directly connected to both the extender 135 and under-metal layer 115.

In addition, the first via layer is positioned directly laterally adjacent the write wordline 125. The first via layer is comprised of a $1^{st}$ via 405 electrically coupling under-metal layer 115 to the extender 135 by way of a third via 110. By constructing the first via layer directly laterally adjacent to the write wordline (WWL) 125, this locates the $1^{st}$ via 405 directly horizontal to the WWL 125 as shown in FIG. 4. As illustrated, the width $W_1$ of the $1^{st}$ via 405 is substantially less than the width $W_2$ ($W_1 << W_2$) of the conventional landing pad 140 seen in the conventional cell 100 connecting the via from the under-metal layer 115 and the $3^{rd}$ via 110. Because the conventional landing pad 140 is not provided in the disclosed structure, the overall decreased width of the read structure (specifically, the width $W_1$ of the $1^{st}$ via 405, which is the widest component in the read structure) is less than the width of conventional read structures employing the landing pad 140 (which is the widest component in the conventional structure). In addition, as shown in FIG. 4, the $2^{nd}$ metal under-layer coupled to the $1^{st}$ via 405 is formed under a portion of the data control line WWL. Thus, the reading structure can be constructed closer to the write wordline 125 than is possible using structures employing the landing pad 140. As a result, the overall width of the new memory cell $W_3$ is substantially less than the overall width $W_4$ of the conventional memory cell 100.

Looking closer at the disclosed new reading structure, the $1^{st}$ via 405 is no longer connected to a conventional metal landing pad 140, and is a damascene-produced conductor. Instead, the $1^{st}$ via 405 is directly connected between the $2^{nd}$ metal under-layer 115 and the $3^{rd}$ via 110 (and thus to the bottom electrode of the MTJ stack 50). In addition, as illustrated in the novel structure of FIG. 4, the $2^{nd}$ metal under-layer 115 is not only formed directly under the $1^{st}$ via 405, and thus consequently formed under a portion of the extending portion 135, but is also formed under a portion of the data control line WWL. As such, the entire reading structure, and thus the connection from the bottom electrode of the MTJ stack 50 to the $2^{nd}$ metal under-layer 115, is no wider than the width of the $1^{st}$ via 405. In addition, a $2^{nd}$ via 410 outside of the memory cell structure 400, and substantially located in the same metal level with the $1^{st}$ via 405 may be provided. This outside $2^{nd}$ via 410 may be a connection path between an upper layer metal landing pad 415 (the "$4^{th}$ metal layer") and an under metal layer 420 (the "$3^{rd}$ metal"). As such, the plug height of the "first via layer" (the $1^{st}$ via 405+metal layer 115) is substantially the same as the sum of the height of the $3^{rd}$ metal 420+the $2^{nd}$ via 410, as is illustrated in FIG. 4. In addition, in such a structure, the bottom opening area ratio of the $1^{st}$ via 405 to the $2^{nd}$ via 410 may be larger than 1.3×.

Also as illustrated in FIG. 4, a structure outside of the memory cell 400 structure and substantially located in same metal level with $1^{st}$ via 405 may be provided. This outside structure may include a $2^{nd}$ via 410 and another under-metal layer 420 (the "$3^{rd}$ metal layer"), and reaches up to an upper-metal layer 415 (the "$4^{th}$ metal layer"). As such, the plug height of the "first via layer" (the $1^{st}$ via 405+metal layer 115) is substantially the same as the sum of the height of the $3^{rd}$ metal layer 420+the $2^{nd}$ via 410, as is illustrated in FIG. 4. In addition, in such a structure, the bottom opening area ratio of the $1^{st}$ via 405 to the $2^{nd}$ via 410 may be larger than 1.3×. In addition, in such a structure, the bottom opening area ratio of the $1^{st}$ via 405 to the $2^{nd}$ via 410 may be larger than 1.3×.

In an exemplary processes, the metal process for forming the $1^{st}$ via 405 and the metal layer 115, as well as the $2^{nd}$ via 410 and the 3$^{rd}$ metal layer 420, is a dual damascene metal process. In addition, these components may be located substantially in the same level or layer in the substrate, thus allowing their formation at the same time. Moreover, the material of the metal layers and vias may be selected from a group of Cu, TaN, SiC, W, TiN, or a combination thereof. In many embodiments, these metal/via layers are all surrounded by low-k dielectric material. The low-k dielectric material may have a fluorine content, carbon content, air content, porous structure, or may be comprised of any material with a dielectric constant below k=3, or a combination thereof.

Figure 5:
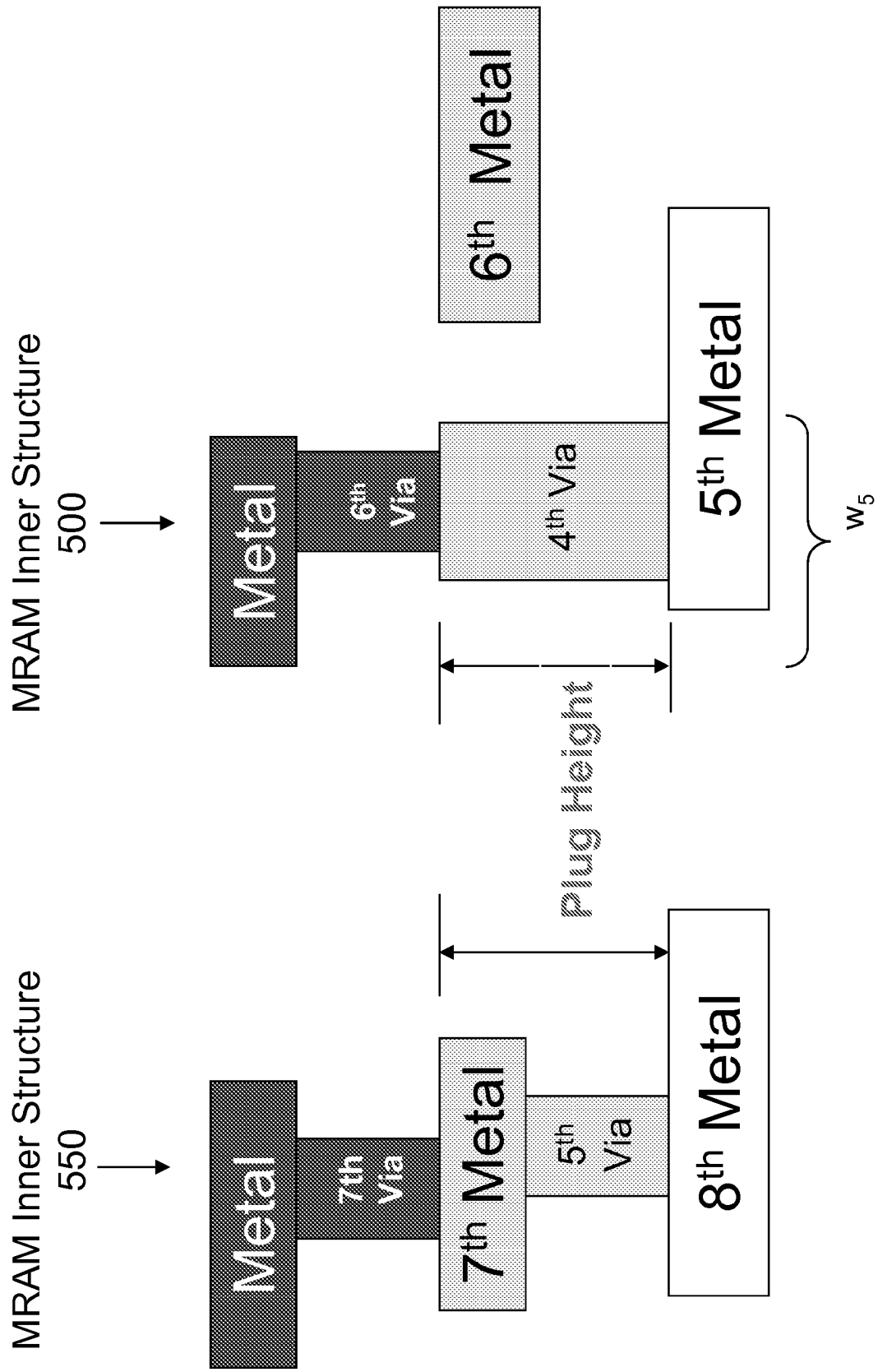
FIG. 5 illustrates other novel structures constructed according to the disclosed principles that are underlying the MRAM cell shown in FIG. 4.

Other embodiments of novel structures constructed according to the disclosed principles are illustrated in FIG. 5. As illustrated, these structures may include a 4$^{th}$ via, a 5$^{th}$ via, a 6$^{th}$ via, and a 7$^{th}$ via, as well as a 5$^{th}$ metal, a 6$^{th}$ metal, a 7$^{th}$ metal, and an 8$^{th}$ metal. These structures may comprise interconnect structures both directly under the MRAM cell 400 ("inside" structure 500"), and interconnect structures ("outside structure 550") directly under the outside structure illustrated in FIG. 4. Specifically, the 4$^{th}$ via, 6$^{th}$ via, 5$^{th}$ metal and 6$^{th}$ metal are located "inside" the MRAM cell 400 structure, while the 5$^{th}$ via, 7$^{th}$ via, 7$^{th}$ metal and 8$^{th}$ metal are located "outside" of the MRAM cell 400 structure. Accordingly, these metals and vias, and hence the inside and outside structures 500, 550, may all be located at lower metal layers than the 1$^{st}$ via 405.

The 4$^{th}$ via may be adjacent to the 6$^{th}$ metal within a separated space of between about 5 nm to 300 nm. This 4$^{th}$ via may also be connected to the under layer 5$^{th}$ metal. The 5$^{th}$ via is directly connected to the 7$^{th}$ metal (upper layer), and the 8$^{th}$ metal (under layer). Moreover, the 4$^{th}$ via, the 5$^{th}$ via and the 6$^{th}$ metal are located in substantially the same metal level. In exemplary embodiments, the bottom landing area ratio of the 4$^{th}$ via to the 5$^{th}$ via is larger than 1.3×. Exemplary embodiments for this type of structure would be to employ the 6$^{th}$ metal as the read wordline conductor discussed above. Thus, as with the embodiments discussed with reference to FIG. 4, the 6$^{th}$ metal (read wordline) may be placed closer to the 4$^{th}$ via because the 4$^{th}$ via is constructed all the way up to directly contact the 6$^{th}$ via, rather than including a landing pad between these two vias. Accordingly, as the overall width $W_3$ of the MRAM cell 400 shown in FIG. 4 decreased by eliminating the use of a landing pad, so too does the overall width $W_5$ of the inside structure 500 decrease as compared to conventional under-structures employing a landing pad between the 4$^{th}$ and 6$^{th}$ vias.

In yet other embodiments, the 1$^{st}$ via 405 and the under-metal layer 115 have substantially the same width, and thus appear as a hole-like structure (having a continuous sidewall shape) when being formed, rather than being formed using a dual damascene process. In such embodiments, this structure could be located in substantially the same metal layer as the write word line 125. Also in such embodiments, the bottom landing area ratio of the hole-like structure and 2$^{nd}$ via 410 is larger than 1.5×, such as embodiments where the size (bottom cross-section CD) of the 2$^{nd}$ via 410 is less than 100 nm. In addition, the plug height of the hole-like structure could be substantially the same as the "metal+via" that is located in the same level metal layer.

Figure 6:
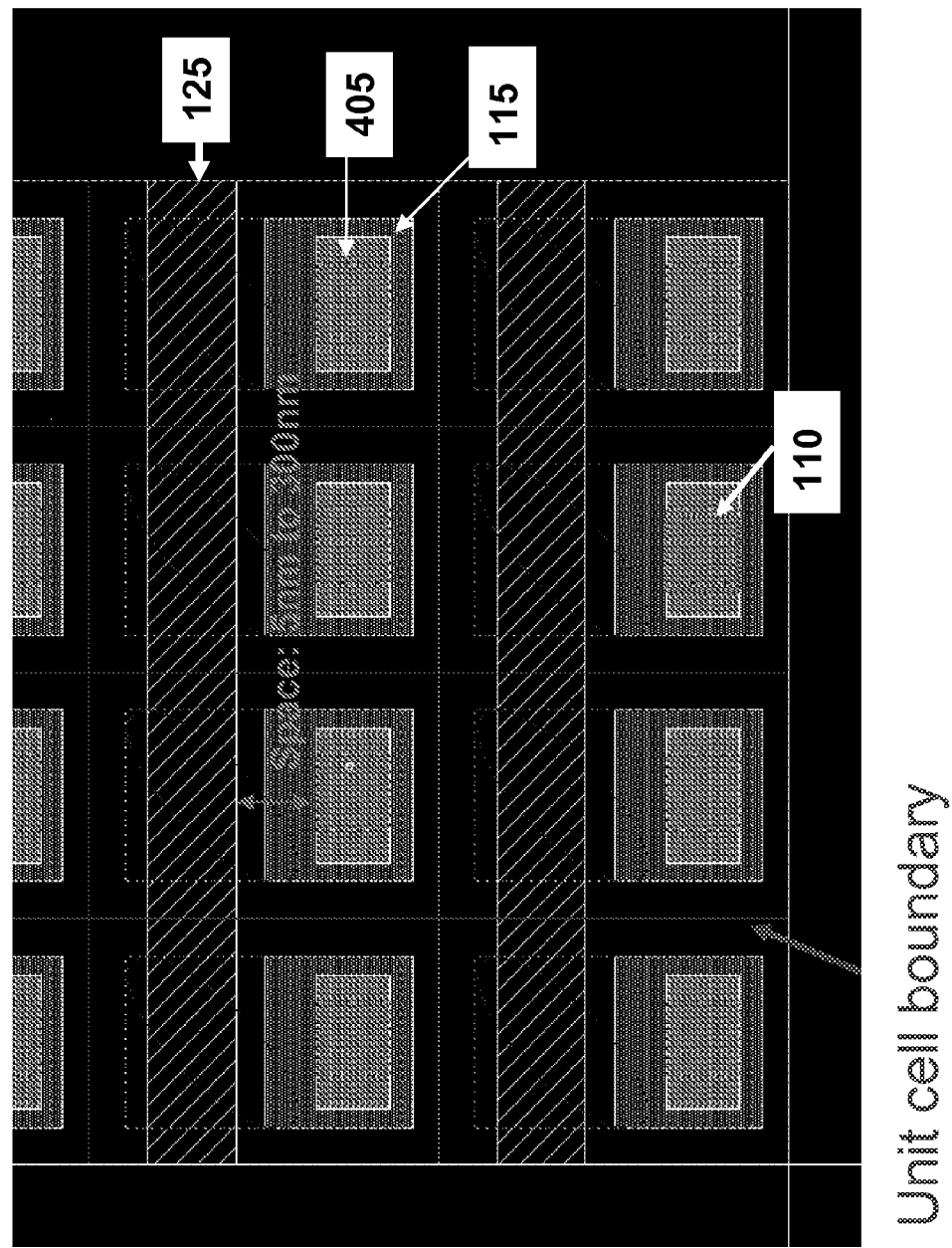
FIGS. 6-8 illustrate CAD drawings of various substrate layers or levels of MRAM cells constructed according to the principles disclosed herein.
Figure 7:
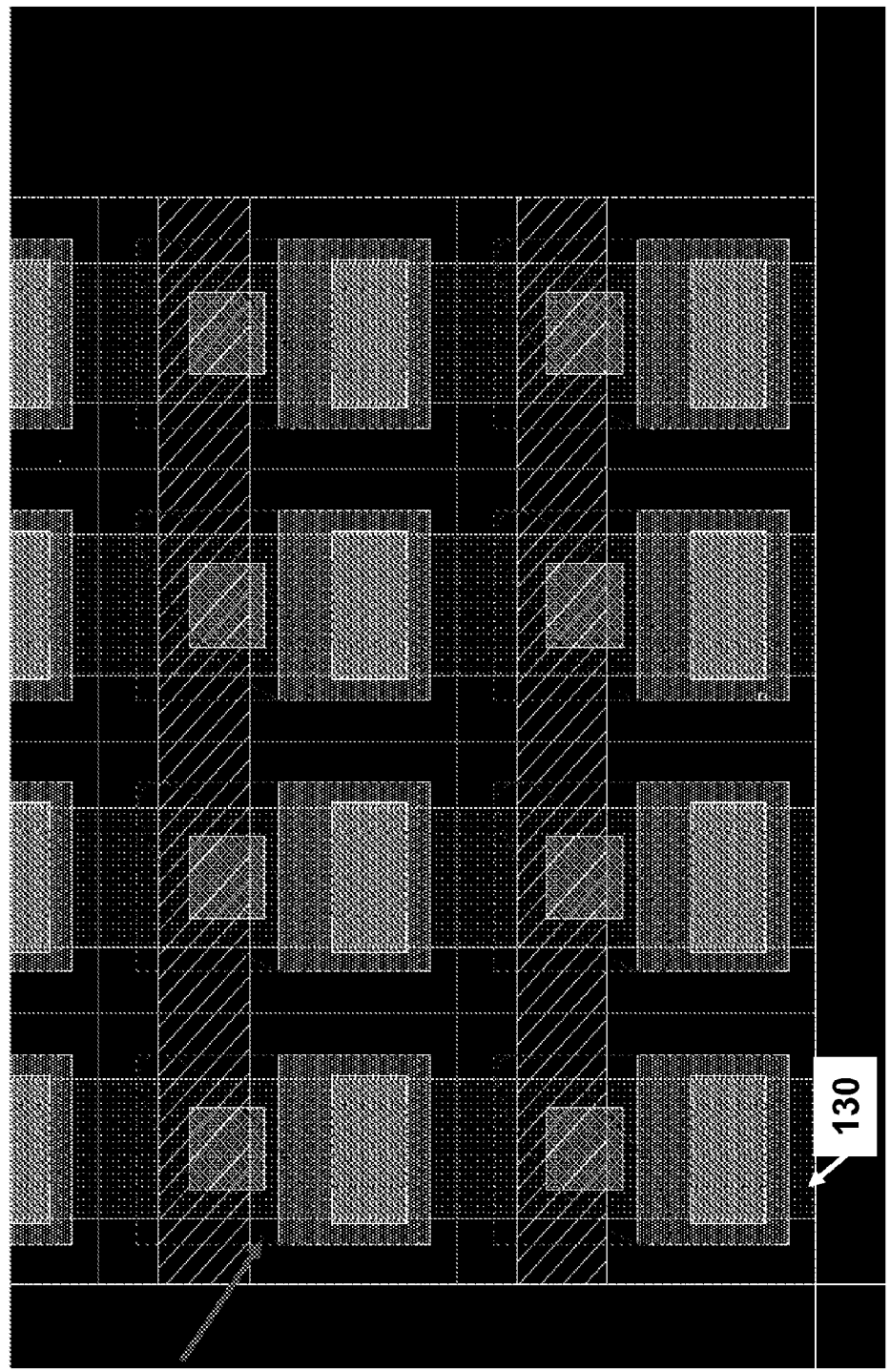
Figure 8:
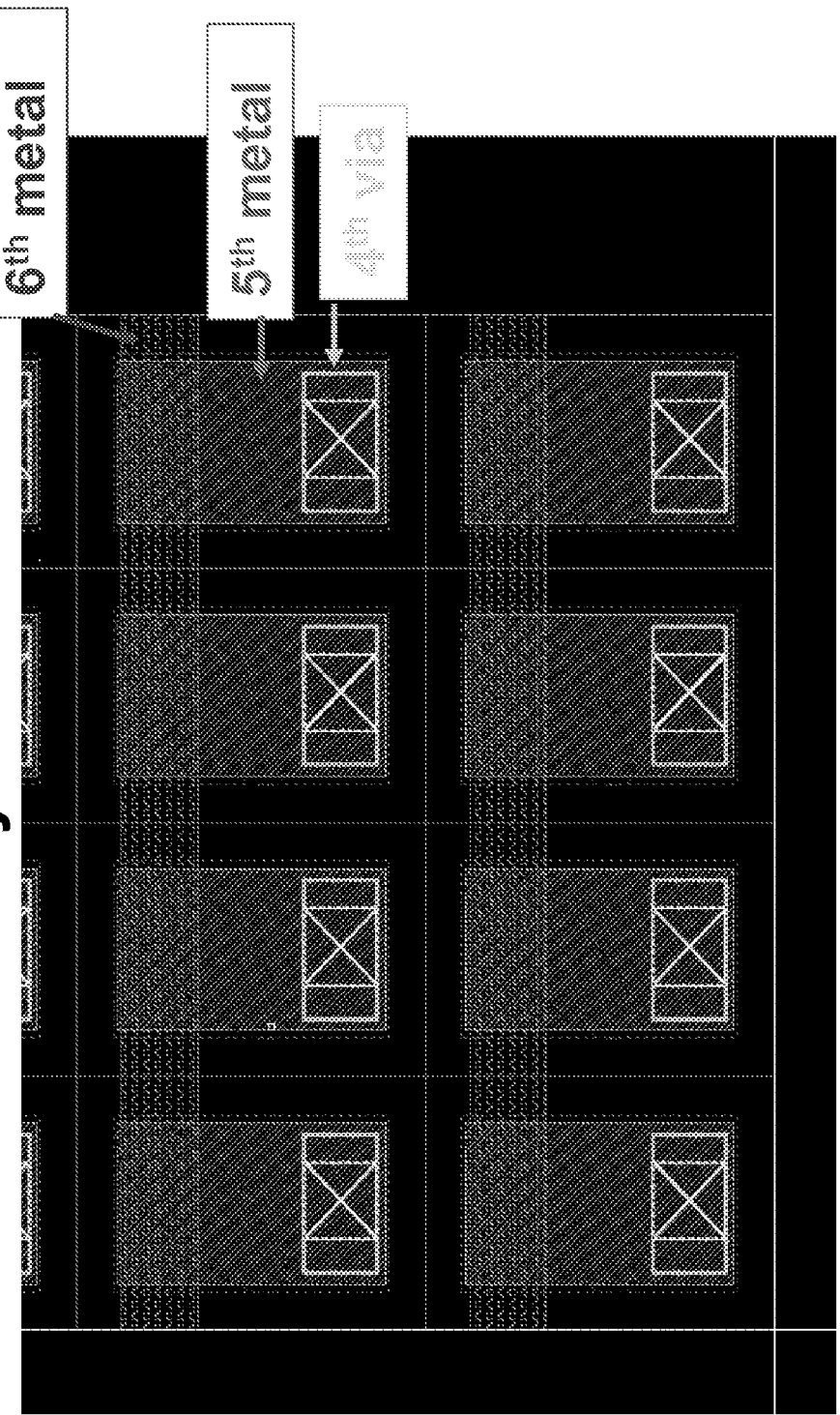

FIGS. 6-8 illustrate CAD drawings of various substrate layers or levels of MRAM cells constructed according to the principles disclosed herein. Specifically, FIGS. 6 and 7 illustrate certain levels of the MRAM cell 400 and outside structure shown in FIG. 4, while FIG. 8 illustrates underlying structures shown in FIG. 5.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory cell structure, comprising:
   a memory stack having a bottom electrode and a top electrode;
   a conductive extender electrically connected to the bottom electrode and having an extending portion laterally extending from the memory stack, the memory stack formed on a main portion of the extender;
   a data control line for controlling a memory state of the memory stack and formed directly vertically beneath the memory stack and the main portion of the extender, but not in electrical contact with the memory stack or the main portion of the extender;
   an under-metal layer formed directly vertically beneath at least a portion of the extending portion and directly vertically beneath at least a portion of the data control line, the under-metal layer electrically coupled to a switching device for reading the memory state of the memory stack; and
   a via structure directly connecting the extending portion to the under-metal layer, and formed directly and laterally adjacent to the data control line.

2. A memory cell structure according to claim 1, wherein the via structure comprises a first via directly connected to the under-metal layer, and a third via formed directly on the first via and connected to the extending portion, wherein the first via provides a maximum width of the via structure.

3. A memory cell structure according to claim 2, wherein the under-metal layer and the first via are formed using a dual damascene metal process.

4. A memory cell structure according to claim 3, wherein the under-metal layer and the first via are comprised of materials selected from the group consisting of Cu, TaN, SiC, W, TiN, or a combination thereof.

5. A memory cell structure according to claim 1, further comprising dielectric materials surrounding the under-metal layer and via structure.

6. A memory cell structure according to claim 5, wherein the dielectric material is a low-k dielectric materials comprising a fluorine content, carbon content, air content, porous structure, or a combination thereof.

7. A memory cell structure according to claim 1, wherein the data control line is formed in a first direction and the cell structure further comprises a power supply line formed in a second direction and electrically connected to the top electrode of the memory stack.

8. A memory cell structure according to claim 7, wherein the first and second directions are substantially perpendicular to each other.

9. A memory cell structure according to claim 1, wherein the memory cell structure comprises a non-volatile memory cell selected from the group consisting of an MRAM cell, an SRAM cell, a DRAM cell, or a combination thereof.

10. A memory cell structure according to claim 1, wherein the switching device is a transistor.

11. A memory cell structure, comprising:
    a memory stack having a bottom electrode and a top electrode;
    a conductive extender electrically connected to the bottom electrode and having an extending portion laterally extending from the memory stack, the memory stack formed on a main portion of the extender;
    a data control line for controlling a memory state of the memory stack and formed directly vertically beneath the memory stack and the main portion of the extender, but not in electrical contact with the memory stack or the main portion of the extender;
    an under-metal layer formed directly vertically beneath the extending portion and directly vertically beneath at least a portion of the data control line, and directly electrically coupled to a switching device via a plug, the switching device operable for reading the memory state of the memory stack; and
    a via structure directly connecting the extending portion to the under-metal layer, and formed directly and laterally adjacent to the data control line.

12. A memory cell structure according to claim 11, wherein the via structure comprises a first via directly connected to the under-metal layer, and a third via formed directly on the first via and connected to the extending portion, wherein the first via provides a maximum width of the via structure.

13. A memory cell structure according to claim 12, wherein the under-metal layer and the first via are formed using a dual damascene metal process.

14. A memory cell structure according to claim 11, further comprising dielectric materials surrounding the under-metal layer and via structure.

15. A memory cell structure according to claim 14, wherein the dielectric material is a low-k dielectric materials comprising a fluorine content, carbon content, air content, porous structure, or a combination thereof.

16. A memory cell structure according to claim 11, wherein the data control line is formed in a first direction and the cell structure further comprises a power supply line formed in a second direction and electrically connected to the top electrode of the memory stack.

17. A memory cell structure according to claim 16, wherein the first and second directions are substantially perpendicular to each other.

18. A memory cell structure according to claim 11, wherein the memory cell structure comprises a non-volatile memory cell selected from the group consisting of an MRAM cell, an SRAM cell, a DRAM cell, or a combination thereof.

19. A memory cell structure according to claim 11, wherein the via structure and the under-metal layer have substantially the same maximum width.

20. A memory cell structure according to claim 11, wherein the switching device is a transistor.

* * * * *